Figure 4:
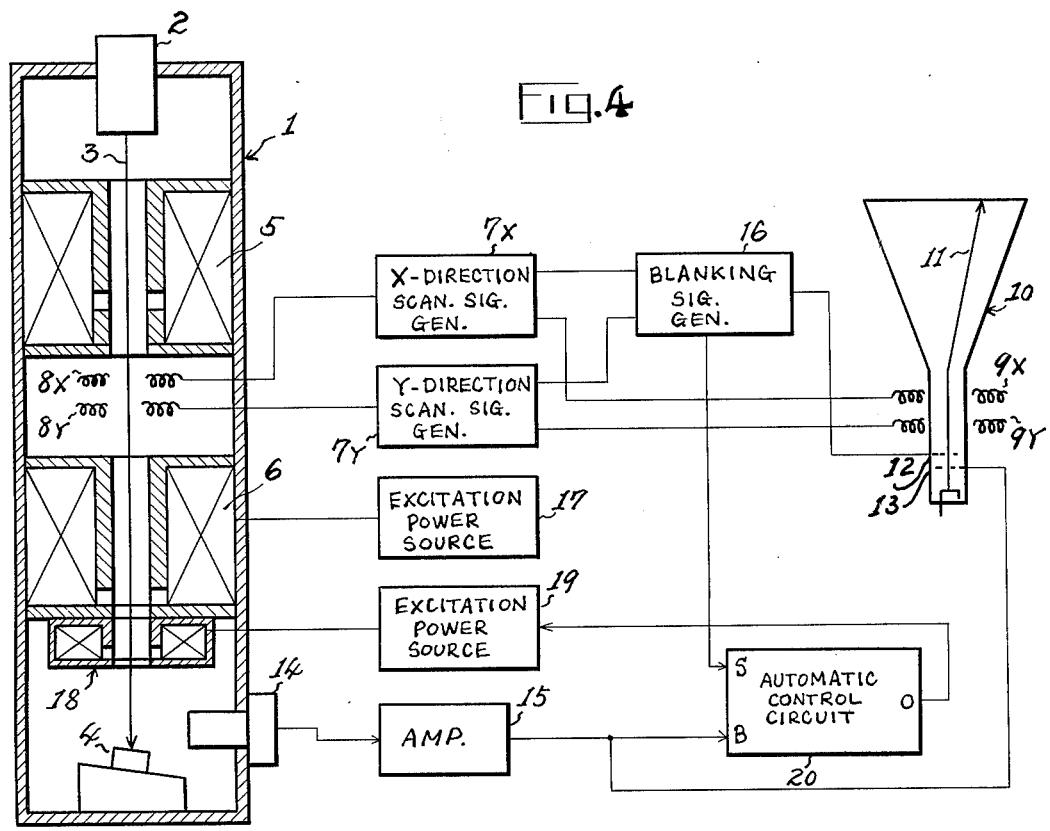

United States Patent [19]
Namae

[11] 3,937,959
[45] Feb. 10, 1976

[54] METHOD AND APPARATUS FOR AUTOMATICALLY FOCUSING

[75] Inventor: Takao Namae, Akishima, Japan

[73] Assignee: Nihon Denshi Kabushiki Kaisha, Tokyo, Japan

[22] Filed: Dec. 24, 1974

[21] Appl. No.: 536,188

[30] Foreign Application Priority Data
Dec. 24, 1973 Japan.................................. 49-1436
Apr. 24, 1974 Japan................................ 49-46286

[52] U.S. Cl.............................. 250/311; 315/31 R
[51] Int. Cl.².................... G01N 23/00; G21K 7/00; H01K 37/26
[58] Field of Search................. 250/311, 310, 309; 315/31 R, 31 TV

[56] References Cited
UNITED STATES PATENTS
3,356,792  12/1967  Peters............................. 315/31 TV
3,409,799  11/1968  Kurzweil, Jr. et al............. 315/31 R
3,436,589  4/1969  Gaskill, Jr. et al................ 315/31 R Primary Examiner—Archie R. Borchelt
Assistant Examiner—T. N. Grigsby
Attorney, Agent, or Firm—Webb, Burden, Robinson & Webb

[57] ABSTRACT

The sum of the intensity changes of one polarity in the video signal is used as a signal indicative of the diameter of the electron beam irradiating a specimen. A storage counter which produces the signal indicative of the beam diameter is reset periodically in synchronism with the beam scan and two successive outputs of the counter are compared by a comparison circuit. The excitation current of the focusing lens is varied in synchronism with beam scan. The magnitude and polarity (increase or decrease) of the change in excitation current are controlled in response to the output of said comparison circuit to maximize the output of the storage counter.

10 Claims, 27 Drawing Figures

Fig. 1
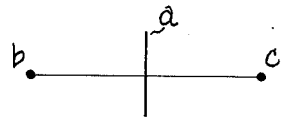
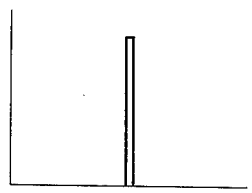
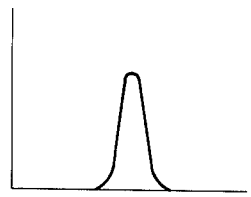
Fig. 2(a)   Fig. 2(b)   Fig. 2(c)
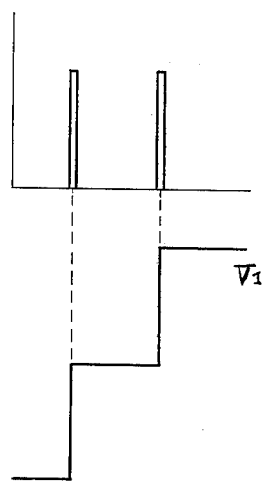
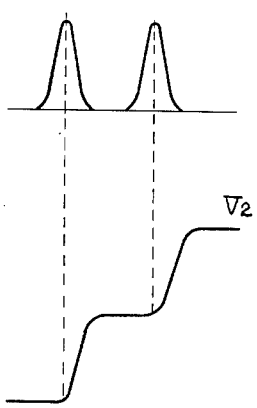
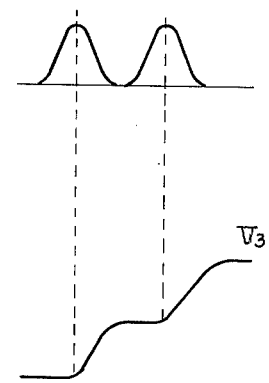
Fig. 3(a)   Fig. 3(b)   Fig. 3(c)

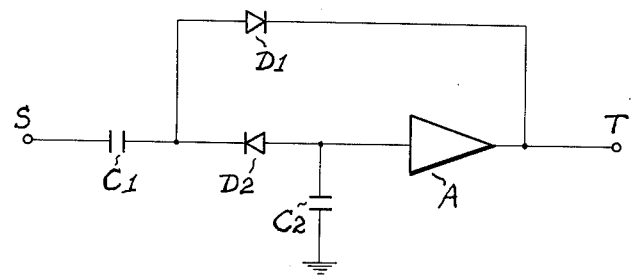
Fig.6
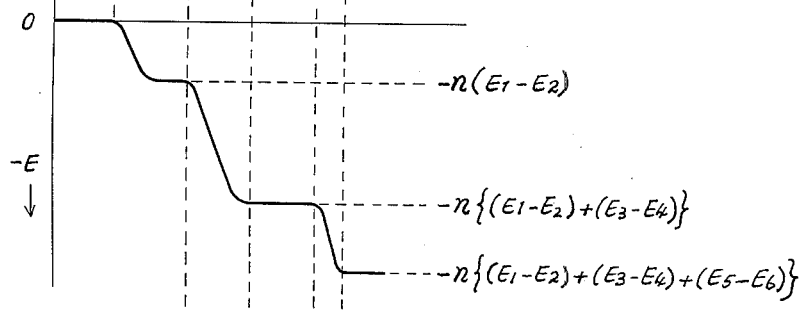
Fig.7 (a)
Fig.7 (b)
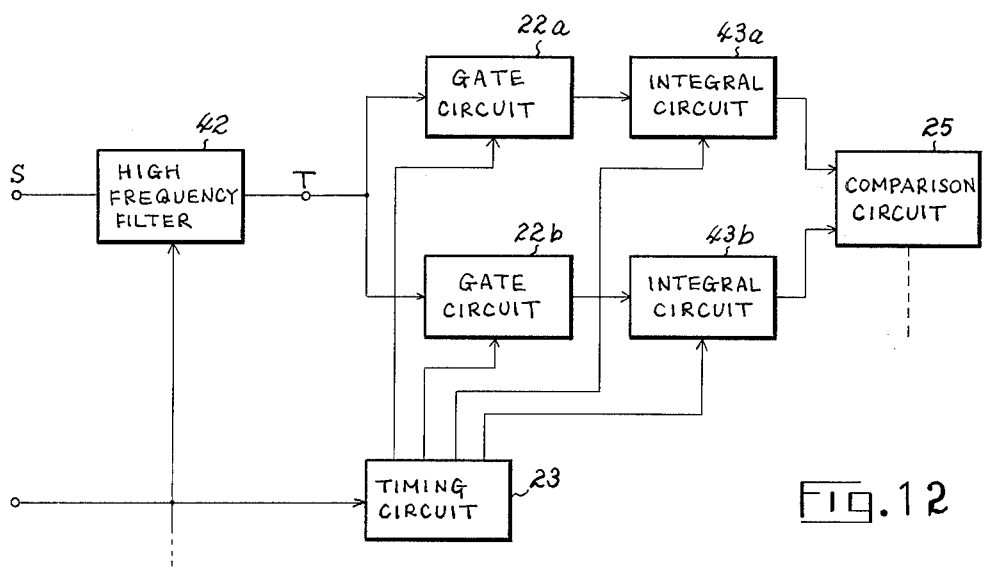
Fig.12

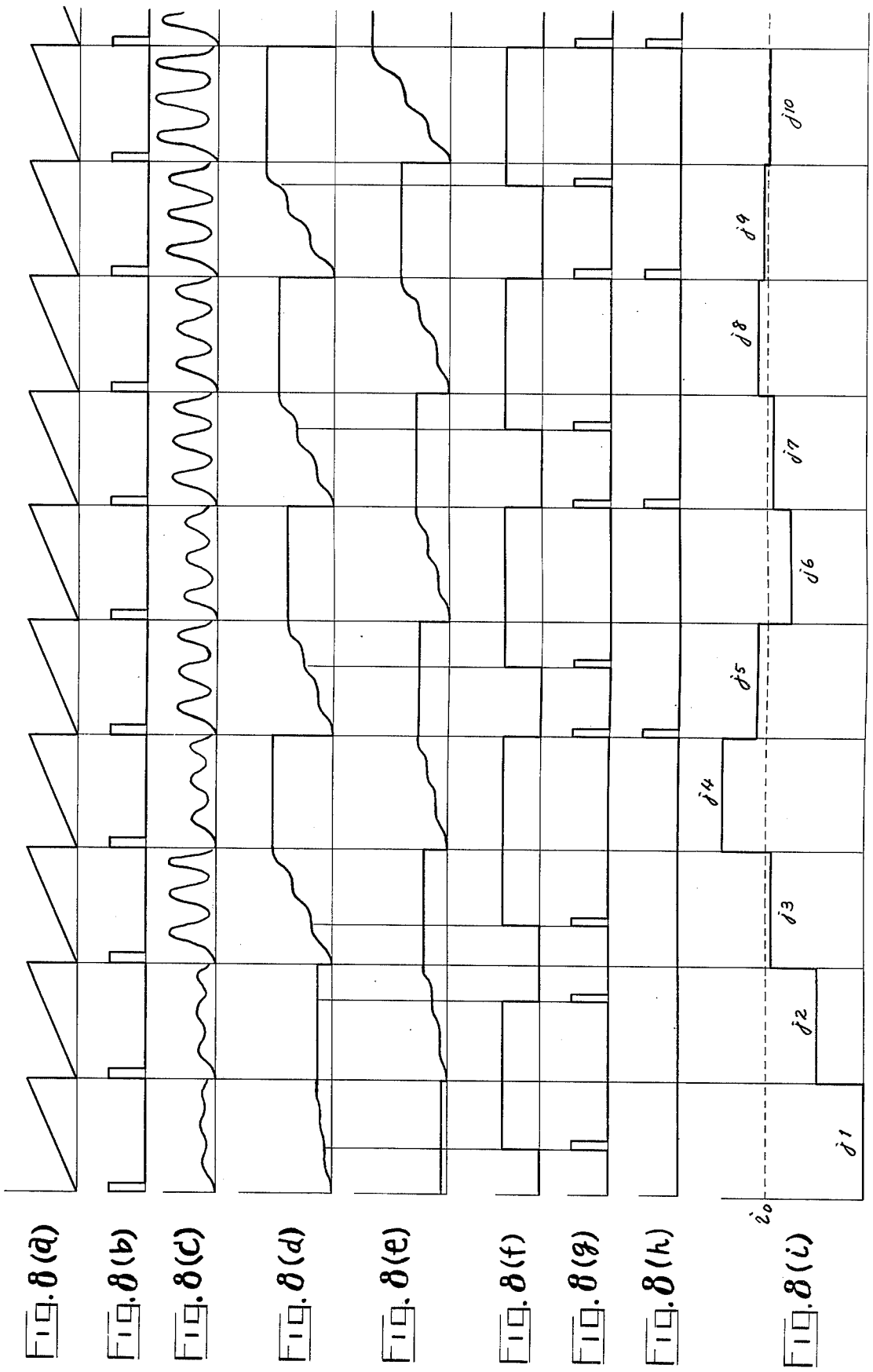

METHOD AND APPARATUS FOR AUTOMATICALLY FOCUSING

This invention relates to a method and apparatus for automatically focusing the electron beam in a scanning electron microscope or other apparatus having an electron optical system.

It is known that to obtain a high resolution image with a scanning electron microscope, it is necessary to irradiate the specimen with an electron beam having a very fine spot diameter. In order to focus the electron beam, the operator must adjust the focal length of the condenser lens in accordance with his own visual assessment of the microscope image, an operation which is extremely exacting and time consuming, especially for a person untrained in this type of adjustment.

Efforts have been made to automate the above focusing operation. One proposed method involves time differentiating the detected signal and then maximizing the differentiated value by controlling the condenser lens excitation current. In this method, however, only the sharpness in the rise (amplitude) of the detector output signal is monitored. Focusing errors due to signal noise are always a possibility, because, although the intensity of ordinary noise is low, the amount of high frequency component contained therein is large. In the case of time differentiation, the differentiated value of the noise component is high, thus making it difficult in practice to judge whether the electron beam is in or out of focus.

An advantage of the present invention is to eliminate visual focusing by providing a method and means for automatically adjusting the condenser lens to give optimum results. Another advantage of this invention is to eliminate the possibility of focusing errors due to noise signals.

Figure 11:
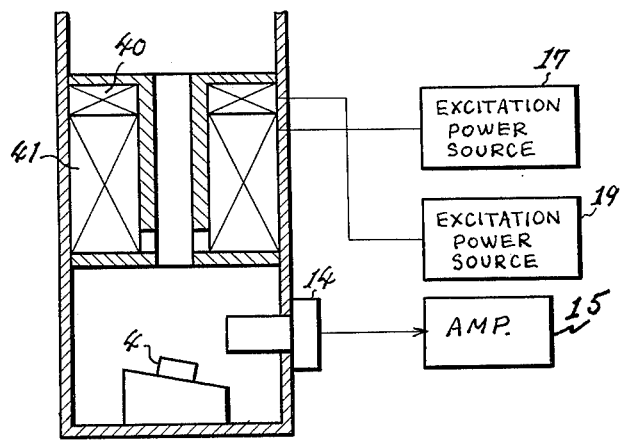
Figure 5:
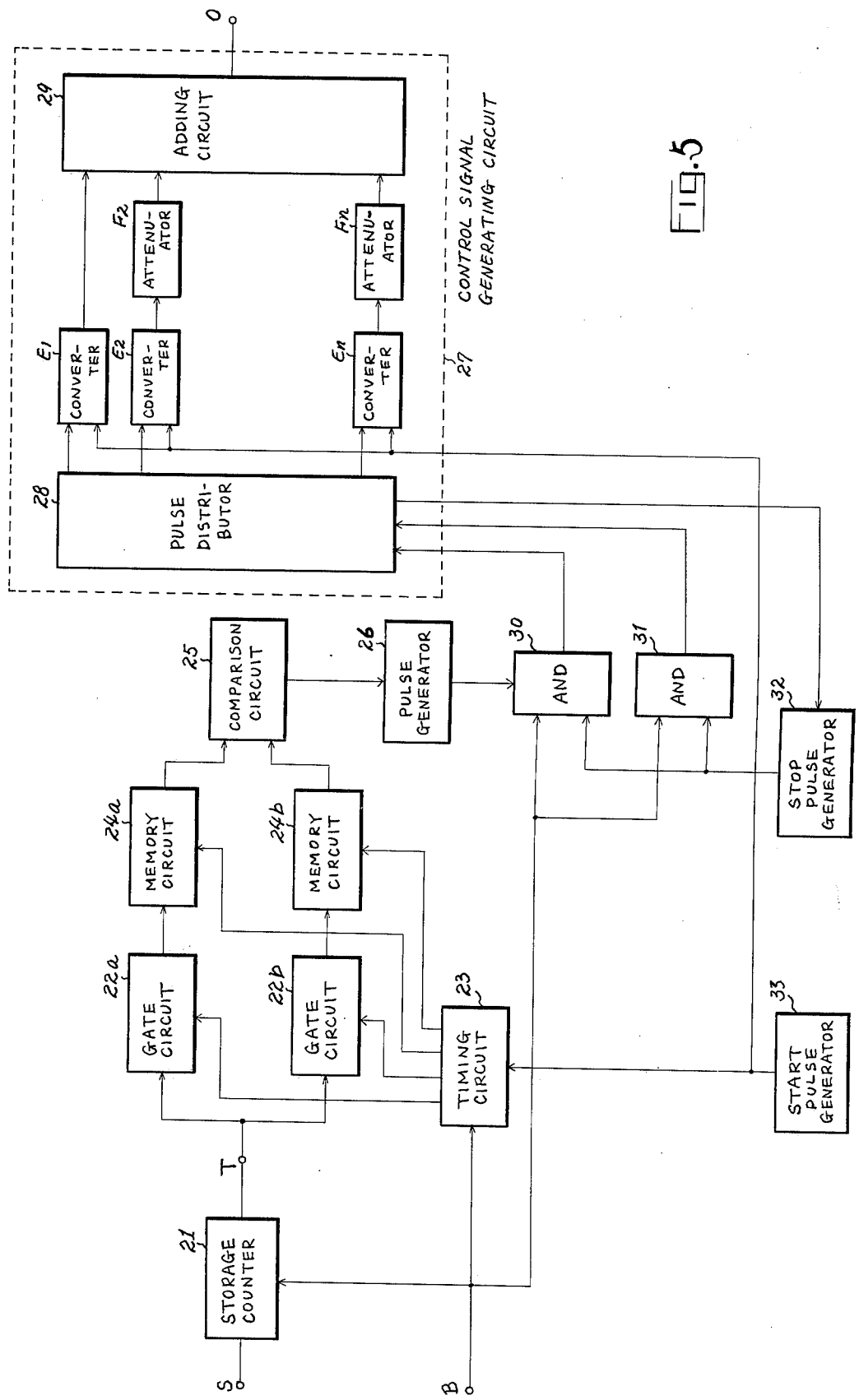
Figure 9:
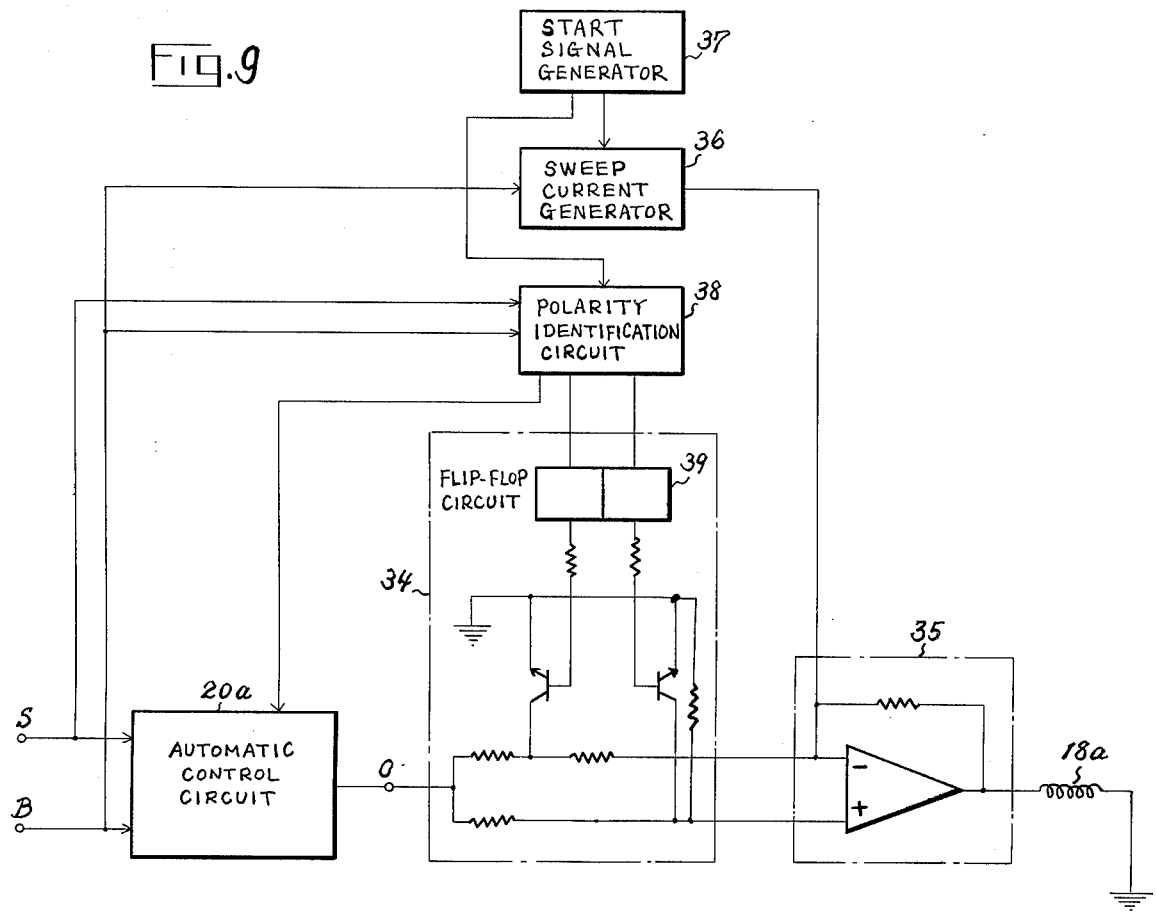
Figure 10A:
Figure 10B:
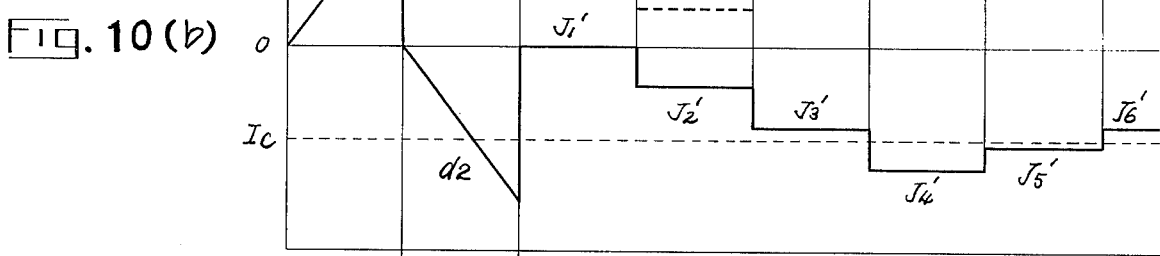
Figure 10C:
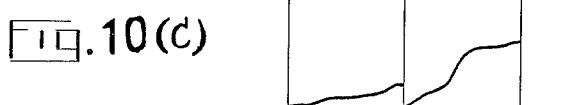

Other objects and advantages of this invention will become apparent by reading the following detailed description in conjunction with the accompanying drawings, wherein:

FIGS. 1, 2a, 2b, 2c, 3a, 3b, and 3c are schematic drawings for explaining the relation between the electron beam diameter and the waveforms of the video signal detected from the specimen, FIG. 4 is a schematic drawing showing one embodiment according to this invention, FIG. 5 is a schematic drawing showing the circuitry for the embodiment shown in FIG. 4, FIG. 6 is a circuit diagram of the storage counter shown in FIG. 5 and forming part of the automatic control circuit shown in FIG. 4, FIGS. 7a, 7b, 8a, 8b, 8c, 8d, 8e, 8f, 8g, 8h and 8i are schematic diagrams for explaining the operational principles of the embodiment shown in FIG. 4, FIG. 9 is a schematic diagram showing circuitry for another embodiment according to this invention, FIGS. 10a, 10b and 10c are schematic diagrams for explaining the operation of the embodiment shown in FIG. 9 and FIGS. 11 and 12 are schematic drawings relating to other embodiments according to this invention.

In FIG. 1, a indicates the line area where the quantity of the generated signal is 1; elsewhere, the quantity of the generated signal is assumed to be 0. FIGS. 2a, 2b and 2c show three spot diameters and their respective detection signals when the electron beam is made to scan an object from point b towards point c shown in FIG. 1. It is apparent from FIG. 2(a) (b) and (c) that the smallest electron beam spot diameter produces the sharpest signal having the greatest amplitude and that, as the beam spot diameter increases, the signal shows a marked tendency to flatten out. Accordingly, if there are two or more signals and their amplitude variations are accumulated or summed, the accumulation or summation values VI, V2 and V3 as shown in FIGS. 3(a), (b) and (c) respectively are obtained. Moreover, if these values are compared, the relationship VI > V2 > V3 is established. That is to say, since the accumulation value is maximum when the electron beam is in focus, automatic focusing can be achieved by comparing the accumulation value at a certain focal length of the condenser lens with the accumulation value at a slightly different focal length and controlling the lens excitation current so as to maximize said accumulation value.

FIG. 4 illustrates one embodiment of a scanning electron microscope according to this invention. A microscope column 1 contains the electron optical system comprising an electron gun 2 for producing an electron beam 3 which irradiates a specimen 4, a first condenser lens 5 and a second condenser lens (objective lens) 6. Mutually synchronized horizontal X-direction and Y-direction scanning signal generators 7X and 7Y, respectively, provide scanning signals to scanning coils 8X and 8Y to make the electron beam 2 scan the surface of the specimen 4 in a two-dimensional raster. Signals generated by the scanning signal generators 7X and 7Y are also supplied to scanning coils 9X and 9Y forming part of the CRT 10 so as to scan electron beam 11 over the CRT screen in a corresponding raster. The intensity of said electron beam is modulated by the varying potential of control grids 12 and 13 and the specimen image is displayed on the CRT screen in accordance with the secondary electrons, X-rays, etc. emanating from the specimen due to electron beam irradiation, said electrons, etc. being detected by detector 14 and amplified by amplifier 15 prior to being impressed as an electrical signal on control grid 13. The signal applied to control grid 12 is supplied by a blanking signal generator 16 which is synchronized with the X-direction scanning signal generator 7X, the purpose of said signal being to maintain the CRT brightness at the zero level during the so called blanking period; i.e., the retrace time of the multiple X-direction (direct line) scanning. In the apparatus thus far described, the specimen image is focused by adjusting the excitation current power source 17 of the objective lens 6. By adding another small auxiliary lens 18 complete with excitation current power source 19, however, as envisaged in the apparatus according to this invention, and by locating said auxiliary lens near the objective lens 6, the specimen image can be focused both automatically and precisely. This type of automatic and precise focusing control is achieved by automatic control circuit 20 which supplies a control signal to the lens power source 19 based on the video signal from detector 14 and the electron beam scanning blanking signal.

In automatic focusing, according to this invention, the condenser lens focal length varies with each horizontal scan and the video signals obtained during each two horizontal scans are converted into d.c. voltages indicative of the beam diameter of the irradiating electron beam. Thus, it is possible to determine whether or not the focal length of the condenser lens is approaching optimum by comparing the beam diameter signals, i.e. the d.c. voltages for each pair of horizontal scans. If the change in the focal length is made smaller, the focal length of the condenser lens will gradually approach the optimum focal length.

FIG. 5 shows the composition of the automatic control circuit 20 described in FIG. 4. The video signal from the amplifier 15 and the output signal from the blanking signal generator 16 which is synchronized with the scanning signal are fed into the two input terminals S and B respectively. Part of the video signal output from the amplifier 15 is fed into a storage counter 21 via. terminal S. Here, the amplitude variation of the signal is converted into a d.c. signal so as to obtain a signal indicative of the beam diameter. The counter 21 is reset by each blanking signal. A typical storage counter comprises an operational amplifier A, two diodes D1 and D2, and two capacitors, C1 and C2, as shown in FIG. 6. The video signal before and after accumulation respectively is shown in FIG. 7(a) and (b) in which $n$ equals C1/C2. The accumulated output signal of the storage counter 21 is fed into two gate circuits 22a and 22b, said gate circuits being activated and deactivated during one horizontal scanning time in alternate sequence by a pulse signal from a timing circuit 23 which is synchronized with the blanking signal. In other words, when gate circuit 22a is "on," gate circuit 22b is "off," and vice versa. Accordingly, the accumulation value of a signal corresponding to one horizontal scan of the electron beam on the specimen 4 passes through the two gate circuits in alternate sequence. The alternating outputs of the gate circuits 22a and 22b then enter memory circuits 24a and 24b prior to being compared in a comparison circuit 25.

FIGS. 8a to 8i are schematic diagrams for explaining the operation of the embodiment of FIG. 5. FIGS. (a) and (b) show the horizontal scanning signal waveform and pulsed blanking signal respectively. FIG. 8c shows the video signal supplied to the storage counter 21 and FIGS. (d) and (e) are the output signal of the memories 24a and 24b, respectively. The amplitude of these two output signals shown in FIGS. 8 (d) and (e) are compared by the comparison circuit 25 in the embodiment of FIG. 5.

The output of the comparison circuit 25 has rising and falling times as shown by the square wave as shown in FIG. 8 (f). When the accumulated output during one scan exceeds the total accumulated output of the last scan, the comparison pulse rises or falls during scan. Otherwise, a rise or fall occurs at the end of the scan. This square wave signal is then fed into a pulse generator 26 which produces a pulsed output signal waveform as shown in FIG. 8(g). Pulses occur at every rise or fall of the comparison circuit output. As will be seen, these pulses control the polarity of the stepwise change imparted to the focusing current.

A control signal generating circuit 27 produces signals for controlling the current power source 19 of the auxiliary lens 18 and consists of a distributor 28 which supplies current at fixed intervals to converter E1, E2, E3 . . . or En according to the distributor input signals, and an adding circuit 29 which adds the output of said converters E1, E2, . . . En after passing through attenuators F2, F3, . . . Fn. In other words, each converter and associated attenuator when individually and stepwise actuated by control pulses from circuits 30 and 31 change the control signal current. Alternate converters increase or decrease the current (take forward or backward steps). Each succeeding converter and associated attenuator are arranged to take smaller steps.

AND circuit 30 output is fed into the pulse distributor 28 as a control signal, and control signal only being generated when the blanking signal (b) and the pulse signal (g) are in accord as shown in FIG. 8(h). This signal serves as a shift signal for actuating the next converter E1, E2, . . . En. The output pulses (blanking pulses) of a second AND circuit 31 are also applied to the pulse distributor 28 as a further control signal for varying the d.c. current supplied to said converter, E1, E2, . . . or En stepwise each time a horizontal scanning signal is generated. A blanking signal is applied to one of the AND circuit 31 input terminals.

FIG. 8 (i) shows the waveform of the output signal at terminal 0 of control circuit 27. J1, J2, J3 and J4 show the state or condition where the control signal is varied stepwise by converter E1 each time a horizontal scanning signal is generated. When the auxiliary lens current exceeds the correct current $i_o$, pulses (h) from the AND circuit 30 are generated so as to reverse the direction of the control current (see J5 and J6) by sustaining the output of the converter E1 and, at the same time, activating the next converter E2. Concurrently, the step current width is reduced to less than that in the case of J1, J2, J3 and J4 by attenuator F2. when the J6 condition is reached, converter E2 is kept in the activated condition and converter E3 starts to operate and gradually approaches the optimum value $i_o$. The above sequence continues until the final converter En commences to operate, at which time, the stop pulse generator 32 generates a stop signal by the signal from the pulse distributor 28. Further, a start signal generator 33 supplies a start signal to the timing circuit 23 so as to start the control of the gates 22a and 22b, and memories 24a and 24b, and supplied to the circuit 27 so as to reset the converters E1, E2, . . . En. By so doing, the image is accurately and automatically focused only during the extremely short period of time which the start signal generator 33 is in operation.

FIG. 9 is a schematic diagram showing the circuitry for another embodiment of this invention. In the FIG., 18a represents the auxiliary lens coil shown in FIG. 4 and 20a is a control circuit which is more or less the same as the control circuit described in FIG. 5. This embodiment differs, however, from the previously described embodiments in that a circuit 34 for controlling the polarity of the current supplied to the coil 18a from the control circuit 20a and an amplifier 35 are provided between the output 20a and the coil 18a. Moreover, this embodiment is so designed that the control circuit 20a does not come into operation until the polarity identification circuit 38 deactivates (i.e., until the operation of circuit 34 is complete). The output current I (see FIG. 10(b)) supplied to the coil 18a from the sweep current generator 36 remains zero except during the judgment of the polarity. That is to say, when the start signal generator 37 generates a signal, the sweep current generator 36 generates a sweep signal as shown by d1 and d2 in FIG. 10(b) which is synchronized with the blanking signal shown in FIG. 10 (a). Further, a signal from the start signal generator 37, which is synchronized with a blanking signal fed in through terminal B, is applied to a polarity identification circuit 38. By so doing, circuit 38 detects and converts the respective video signals into voltages having values corresponding to those of the diameter of the beam irradiating the specimen as shown in FIG. 10 (c). The size of the two detection values are compared and the high value is identified and selected signal is then applied to a flip-flop circuit 39 forming part of the polarity control circuit 34. For example, in the case of the correct focus current value Ic as shown in FIG. 10 (b), since a high detection value is obtained when the sweep current is d2, a signal which moves in the negative direction. Circuit 34 determines whether the output signal from the control circuit 20a is supplied to the + or − terminals of the amplifier 35. Upon completion of this operation, control circuit 20a is brought into operation by a start signal generated by the polarity identification circuit 38. In this way, the current supplied to the correction coil varies as shown by J1', J2', J3', ... etc. in FIG. 10(b), thereby gradually approaching the correct focus current value Ic. The difference between the embodiment described in FIG. 9 and the previously described embodiment is in that the shift from J1' to J2' is normally in correct polarity direction, whereas in the previously described embodiments, this is not so (J1' to J2''). In other words, the first step is always in the correct direction.

In the embodiments described above, each electron beam scanning position on the specimen is slightly changed during the automatic focusing operation. However, it is easy to remove the position change by adding a means for keeping the output of the Y-direction scanning signal generator 7Y shown in FIG. 4 constant during the automatic focusing operation.

FIG. 11 is a schematic diagram illustrating another embodiment according to this invention. In the figure, auxiliary lens coils 40 are wound around the objective lens yoke 41, whereas the auxiliary lens 18 is completely independent from the objective lens 6. Further, it is possible to directly control the objective lens power source 19.

FIG. 12 is a schematic diagram showing part of yet another embodiment according to this invention. This embodiment incorporates a high frequency filter 42 and integral circuits 43a and 43b instead of the storage counter 21 and memory circuits 24a and 24b as in the case of the embodiment shown in FIGS. 4 and 5.

Having thus described my invention with the detail and particularity as required by the patent laws, what is desired protected by Letters Patent is set forth in the following claims.

I claim:

1. A method for automatically focusing the electron beam of a scanning device having an electron beam source, a condenser lens system for focusing the electron beam on the specimen, a scanning means for scanning the electron beam over the specimen, a detecting means for detecting the signal emanating from the specimen, and a display means for displaying the specimen image on a display device by using the output signal of said detecting means to modulate the scanning beam of the display device which is in synchronism with said scanning means comprising the steps for:
  a. changing the condenser lens system focal length stepwise in synchromism with said scanning means,
  b. converting the output of said detecting means into a signal indicative of the diameter of said electron beam,
  c. comparing two converting signals indicative of the beam diameter obtained in step (b) and,
  d. controlling the polarity and change width in step (a) in response to the result in step (c) to minimize the beam diameter.

2. In a scanning beam device comprising an electron beam source, a condenser lens system for focusing the electron beam on a specimen, a scanning means for scanning the electron beam over the specimen, and a detecting means for detecting the signal emanating from the specimen caused by the electron beam irradiation, and a display means for displaying the specimen image on a displaying device by using the output signal of said detecting means to modulate the scanning beam of the displaying device which is in synchronism with said scanning means, the improvement comprising control means for changing the focal length of said condenser lens system stepwise in synchronism with said scanning means, a converting means for converting the output of said detecting means into a signal indicative of the diameter of said electron beam during a time interval at each focal length, a comparing means for comparing two successive signals indicative of said beam diameter, and a means for controlling the polarity and width of the stepwise changes of the control means in response to the output of said comparing means to minimize the beam diameter.

3. A scanning beam device as claimed in claim 2, wherein said converting means consists of a high-pass filter and integration circuit.

4. A scanning beam device as claimed in claim 2, wherein said control means is incorporated in the final stage condenser lens power source.

5. A scanning beam device as claimed in claim 2, wherein said control means consists of an independent auxiliary lens coil wound around the conventional yoke of the final stage condenser lens and an auxiliary lens power source.

6. A scanning beam device as claimed in claim 2, wherein said control means consists of an independent auxiliary lens yoke and lens coil complete with lens power source.

7. A method for automatically focusing the electron beam on a specimen in a scanning device having an electron beam source, a condenser lens system for focusing the electron beam on the specimen, a scanning means for scanning the electron beam over the specimen, a detecting means for detecting the signal emanating from the specimen, and a display means for displaying the specimen image on a display device by using the output signal of said detecting means in synchronism with said scanning means comprising the steps for:
  a. changing the condenser lens system focal length stepwise in synchronism with said scanning means,
  b. integrating changes of the output signal of said detecting means to produce a signal indicative of beam diameter,
  c. comparing the two successive scanning output signals obtained in step (b), and
  d. controlling the polarity and change width in step (a) in response to the result obtained in step (c) to minimize the beam diameter.

8. In a scanning beam device comprising an electron beam source, a condenser lens system for focusing the electron beam on the specimen, a scanning means for scanning the electron beam over the specimen, a detecting means for detecting the signal emanating from the specimen by the electron beam irradiation, and a displaying means for displaying the specimen image on a display device by using the output signal of said detecting means in synchronism with said scanning means, the improvement comprising a control means for changing the focal length of said condenser lens system stepwise in synchromism with said scanning means, a storage counter circuit for integrating the intensity changes of the output of said detecting means, to produce a signal indicative of beam diameter, a comparing means for comparing the two successive output signals of said storage counter circuit, and a means for controlling the polarity and change width of the output of said control means in response to the output of said comparing means to minimize beam diameter.

9. A method for automatically focusing the electron beam on a specimen using a scanning device having an electron beam source, a condenser lens system for focusing the electron beam on the specimen, a scanning means for scanning the electron beam over the specimen, a detecting means for detecting the signal emanating from the specimen, and a display means for displaying the specimen image on a display device by using the output signal of said detecting means in synchronism with said scanning means comprising the steps of:
  a. integrating the intensity changes of the output signal of said detecting means to provide a signal indicative of the beam diameter,
  b. comparing the two successive output signals obtained in step (a),
  c. changing the condenser lens system focal length stepwise in synchronism with said scanning means in response to the result obtained in step (b) to minimize the beam diameter.

10. In a scanning beam device comprising an electron beam source, a condenser lens system for focusing the electron beam on the specimen, a scanning means for scanning the electron beam over the specimen, a detecting means for detecting the signal emanating from the specimen by the electron beam irradiation, and a display means for displaying the specimen image on a display device by using the output signal of said detecting means in synchronism with said scanning means, the improvement comprising a storage counter circuit for integrating the intensity changes of the output of said detecting means to produce a signal indicative of the beam diameter, a comparing means for comparing the two successive output signals of said storage counter circuit, and a control means for changing the focal length of said condenser lens system stepwise in synchronism with said scanning means in response to the output of said comparing means to minimize the beam diameter.

* * * * *

UNITED STATES PATENT OFFICE
CERTIFICATE OF CORRECTION

PATENT NO. : 3,937,959

DATED : February 10, 1976

INVENTOR(S) : Takao Namae

It is certified that error appears in the above-identified patent and that said Letters Patent are hereby corrected as shown below:

Claim 7 - Column 6 Line 49
After "integrating" insert --the intensity--.

Signed and Sealed this twentieth Day of April 1976

[SEAL]

Attest:

RUTH C. MASON
Attesting Officer

C. MARSHALL DANN
Commissioner of Patents and Trademarks